United States Patent
Sepe et al.

(10) Patent No.: US 7,639,537 B2
(45) Date of Patent: Dec. 29, 2009

(54) METHOD FOR WRITING DATA IN A NON VOLATILE MEMORY UNIT

(75) Inventors: Paolo Sepe, Quarto (IT); Carlo Cimino, Acerra (IT); Maria Chichierchia, Caiazzo (IT)

(73) Assignee: Incard S.A., Geneva (CH)

( * ) Notice: Subject to any disclaimer, the term of this patent is extended or adjusted under 35 U.S.C. 154(b) by 0 days.

(21) Appl. No.: 12/184,643

(22) Filed: Aug. 1, 2008

(65) Prior Publication Data

US 2009/0046522 A1    Feb. 19, 2009

(30) Foreign Application Priority Data

Aug. 2, 2007    (IT) .................... MI2007A1601

(51) Int. Cl.
*G11C 11/34* (2006.01)

(52) U.S. Cl. ............... 365/185.12; 365/185.28; 365/185.29

(58) Field of Classification Search ............ 365/185.12, 365/185.28, 185.29, 239
See application file for complete search history.

(56) References Cited

U.S. PATENT DOCUMENTS

| | | | |
|---|---|---|---|
| 6,256,232 B1 | 7/2001 | Chang et al. | 365/185.33 |
| 6,766,409 B2 * | 7/2004 | Komatsu et al. | 711/103 |
| 7,362,610 B1 * | 4/2008 | Salter et al. | 365/185.02 |
| 7,385,850 B2 * | 6/2008 | Jeong et al. | 365/185.22 |
| 2006/0174172 A1 | 8/2006 | Nahas et al. | 714/718 |
| 2007/0061504 A1 | 3/2007 | Lee | 711/103 |

FOREIGN PATENT DOCUMENTS

EP    1 486 984 A1    12/2004

* cited by examiner

*Primary Examiner*—Anh Phung
(74) *Attorney, Agent, or Firm*—Lisa K. Jorgenson; Allen, Dyer, Doppelt, Milbrath & Gilchrist, P.A.

(57) ABSTRACT

A method for writing data in a non volatile memory unit having memory pages includes a predetermined number of memory cells storing a memory word being a predetermined sequence of digital values. An erase operation erases the memory words in the memory page, setting the predetermined sequence of digital values to a sequence of complementary values. A program operation stores in the memory cell a word and sets a sequence of a word to be stored. For the memory cells of the memory page, the memory word is compared with the word to be stored. A positive check is returned if complementary values of the sequence correspond to complementary values of the predetermined sequence. If the check is negative, the erase operation is executed. The memory word is compared with the word to be stored and the program operation is executed if the word to be stored is different.

10 Claims, 2 Drawing Sheets

|  | cell 1 | cell 2 | cell 3 | cell 4 |
|---|---|---|---|---|
| page 1 | 00000001 | 00000001 | 00000001 | 00000001 |
| page 2 | 00000001 | 00000000 | 00000001 | 00000001 |
| page 3 | 00000000 | 00000001 | 00000001 | 00000001 |
| page 4 | 00000011 | 00000011 | 01010101 | 01111110 |
| page 5 | 00000001 | 00000001 | 00000001 | 00000001 |

FIG. 1

|  | cell 1 | cell 2 | cell 3 | cell 4 |
|---|---|---|---|---|
| page 1 | 00000000 | 00000001 | 00000001 | 00000001 |
| page 2 | 00000000 | 00000001 | 00000000 | 00000000 |
| page 3 | 11111111 | 00000011 | 00000011 | 00000011 |
| page 4 | 00000011 | 00000011 | 11111101 | 11111110 |
| page 5 | 00000001 | 00000001 | 00000001 | 00000001 |

FIG. 2

METHOD FOR WRITING DATA IN A NON VOLATILE MEMORY UNIT

FIELD OF THE INVENTION

The present invention relates to methods for writing data in a non volatile memory units.

BACKGROUND OF THE INVENTION

As it is known, a method for writing data in a non volatile memory unit provides an erase operation for erasing data previously stored in the memory unit and a program operation for storing the data in the memory unit.

More particularly, the memory unit comprises memory pages including a predetermined number of memory cells, the memory cells storing memory words.

The memory word comprises a predetermined sequence of digital values also indicated as value and complementary value, for example, the sequence 01110010. For clarity, in the following description, the complementary value is associated to the number 0 and the value is associated to the number 1.

More particularly, the erase operation is to erase the memory words stored in the memory cells of a predetermined memory page, setting the predetermined sequence of digital values to a sequence of complementary values 0, while the program operation is to store in the memory cell a word to be stored, setting a sequence of digital values of such words in the memory cell.

More particularly, the erase operation is executed before a program operation for setting the values of 1 in the predetermined sequence to the complementary value 0, since the program operation may not change a value 1 into a complementary value 0.

For example, the program operation may not store a word 00010101 in a memory cell that stores the memory word 01010101, since the second value 1 of the memory word 01010101 may not be overwritten by the second complementary value 0 of the word 00010101 without an erase operation.

So an erase operation is executed before the program operation, to erase the predetermined sequence 01010101 into a sequence of complementary values 00000000, after that the program operation is executed.

Physical constraints of the memory unit, however, may limit the number of erase and program operations that can be executed for writing data.

This method may significantly stress the memory unit since each writing involves at least one erase operation and one program operation. Moreover, the number of erase operations and program operations increases significantly when power interruption protection for data is used, for example power off protection.

Power off protection is helpful to preserve data stored in the memory unit during the execution of the writings. More particularly, data stored in the memory unit before the execution of the writing are preserved in a specific portion of the memory unit, also indicated as a backup buffer.

If an unexpected power off occurs during the execution of the method, the data stored in the backup buffer is restored in the memory unit, so that an inconsistent value of data in the memory unit may be prevented.

Even if advantageous, because safe, power off protection increases the number of executions of the method for writing since an additional erase operation and an additional program operation are involved respectively to erase the backup buffer for erasing data previously stored, and to program it for storing the data of the memory unit intended to be updated.

Moreover, if a power off occurs during the execution of the method, the number of writing operations further increases.

In fact, since the memory unit may be restored with the values of the backup buffer, another erasing operation and another program operation are involved, respectively to erase the memory unit, for erasing data in an inconsistent state, and to program it, restoring data from the backup buffer.

SUMMARY OF THE INVENTION

An object of the present invention is to provide a method for writing a non volatile memory unit that reduces the number of erase operations on memory pages and the number of program operations on memory cells, not only when such data is to be written with power interruption protection but also when power interruption protection is not required, to reduce unnecessary stress on the memory unit and to extend the life time of the memory unit.

A method is for writing data in a non volatile memory to prevent an execution of an erase operation if values of a sequence of digital values intended to be stored in memory unit correspond to values of a predetermined sequence of digital values already stored in the memory unit. Moreover the method is also to preventing a program operation when the word intended to be stored in the memory cell is already stored in the memory unit.

An aspect is directed to a method for writing data in a non volatile memory unit comprising memory pages, the pages including a predetermined number of memory cells, the memory cells storing memory words (mw), the memory words comprising a predetermined sequence (pre) of digital values also indicated as values and complementary values. The method provides an erase operation for erasing the memory words in the memory page, and setting the predetermined sequence to a sequence of complementary values, a program operation for storing a word to be stored in the memory cell, and setting a sequence of digital values of the word to be stored in the memory cell, for the memory cell of the memory pages, comparing the memory words stored with the word to be stored and returning a positive check if complementary values of the sequence correspond to complementary values of the predetermined sequence. If the check is negative, the erase operation is executed. For the memory cells, the method compares the memory words stored with the word to be stored and executing the program operation if the word to be stored is different from the memory words stored. The steps are repeated for the memory pages wherein the data is to be stored.

If the check is negative, the erase operation is skipped.

BRIEF DESCRIPTION OF DRAWINGS

FIG. 1 schematically shows predetermined data stored in a memory unit, before an execution of a method for writing data according to the present invention.

FIG. 2 schematically shows data to be stored in the memory unit of FIG. 1, according to the method of the present invention.

DETAILED DESCRIPTION OF THE PREFERRED EMBODIMENTS

Figure 3:
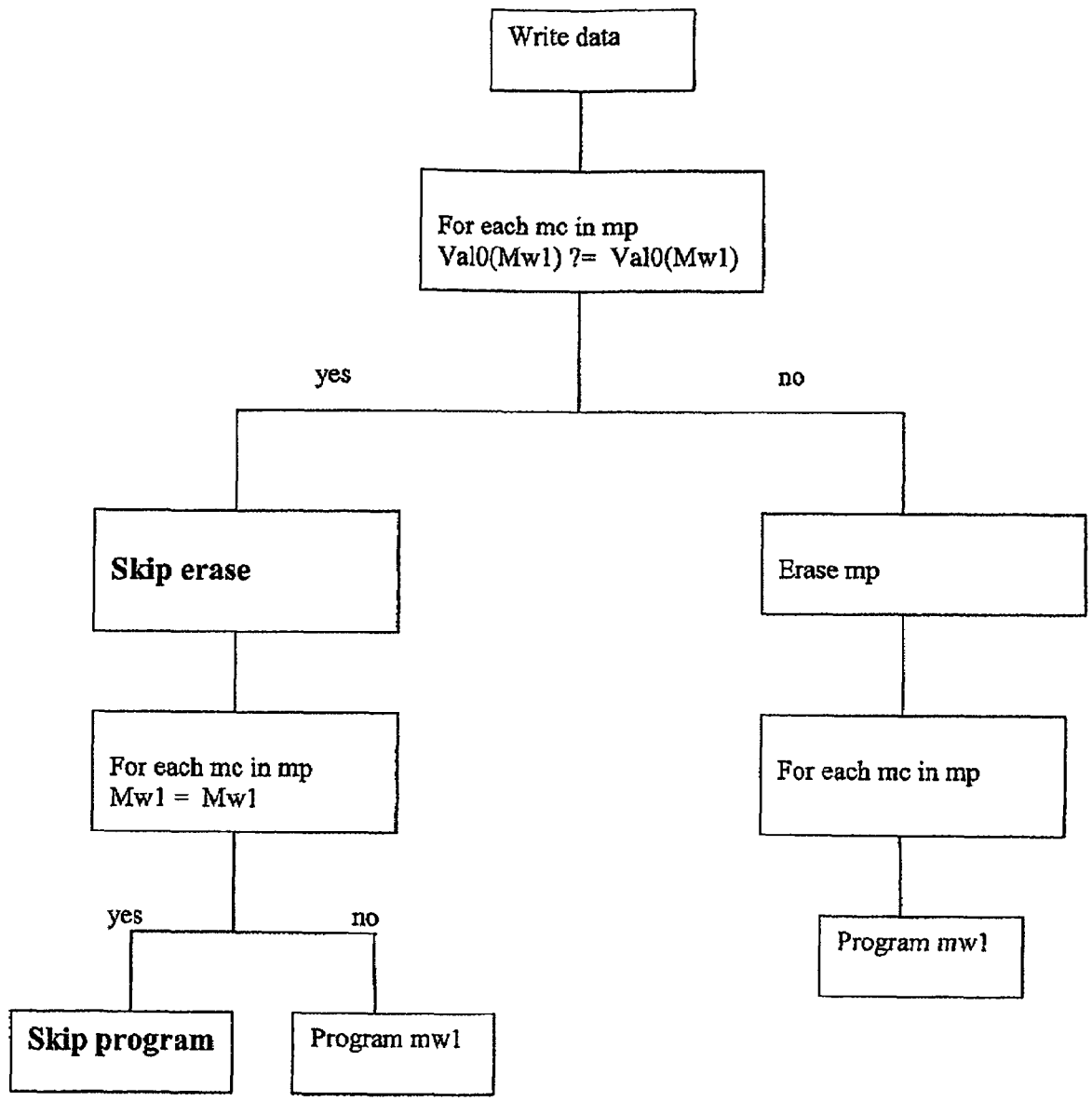
FIG. 3 schematically shows, in a block diagram, the phases of execution of the method according to the present invention.

Other features and advantages of the method will be apparent from the following description of an embodiment thereof, given by way of non-limitative example with reference to the accompanying drawings.

With reference to the annexed drawing, it is schematically represented with numeral reference 1 a non volatile memory unit comprising a plurality of memory pages, the memory pages mp including a predetermined number of memory cells.

More particularly, a memory cell mc stores a memory word mw comprising a predetermined sequence, hereafter indicated as pre, of digital values, also indicated as values and complementary values.

Without limiting the scope of protection and only for clarity reasons, the complementary value is also indicated as logic level 0 or complementary value 0, while the value is also indicated as a logic level 1 or value 1.

The method provides an erase operation for erasing the memory words mw stored in the memory cells mc of the memory page mp. More particularly, the erase operation provides for setting the predetermined sequence of digital values to a sequence of complementary values 0.

The method also provides a program operation for storing a word mw1 intended to be stored in the memory cell of the memory unit 1. More particularly, program operation provides for setting a sequence, hereafter indicated as post, of digital values of the word to be stored mw1 in the memory cell mc.

According to the method, for memory cells mc of the memory page mp, a page check phase is executed for comparing the memory word mw stored with the word mw1 intended to be stored in the memory unit 1.

The page check phase returns a positive check, also indicated as positive value, if complementary values 0 in the sequence post of digital values corresponds to complementary values 0 in the predetermined sequence pre of digital values; in other words the page check phase compares bit per bit the memory word mw with the word mw1 and returns a negative value if one bit of the word mw1 is 0 while the corresponding bit of the memory word mw is 1.

If the value returned by the page check phase is negative, the method provides to execute an erase operation on the memory page mp.

On the contrary, if the value returned by the page check phase is positive, the method skips the erase phase.

Advantageously, the method avoid to stress the memory unit 1 skipping the unnecessary erase operations on memory pages wherein the complementary values 0 intended to be stored are already set such to complementary values 0 in the memory pages.

The cell check phase is executed for the memory cells mc for comparing the memory word mw stored with the word mw1 to be stored, returning a positive value if the memory word mw is equal to the word mw1.

More particularly, if the cell check phase returns a positive value the method skips the program operation since the word mw1 is substantially already stored in the memory cell mc, and may be equal to the memory word mw.

Advantageously, the method avoid to stress the memory unit 1 skipping the unnecessary program operations on memory cells wherein the memory word mw is equal to the word mw1 intended to be written.

On the contrary, if the value returned by the cell check phase is negative the method provides to execute the program operation for storing the word intended to be stored mw1 in the memory cell mc.

The page check phase, the cell check phase and, in some cases, the erase and program operations are repeated for the memory page mp wherein the data is to be stored.

More particularly, if the check is negative and the erase operation has already been executed on a memory page mp, the word mw1 intended to be stored is compared with an erased memory cell 00000000 so that the program operation is skipped if also the word mw1 to be stored is 00000000.

In the example given above the complementary value is supposed to be the number 0, or a low level value, and the value 1 is supposed to be the number 1, or an high level value.

However, the complementary value may be associated to the number 0 or a high level value, and the value 1 may be associated to the number 0, or a low level value.

Moreover the erase operation may be implemented to erase the memory page mp by setting its memory cells mc with the sequences 00000000 or with the sequences 11111111.

The negative check is returned when a first mismatch between the complementary values (0) of the sequence post and the complementary values (0) of the predetermined sequence (pre) is detected.

In this way the check of a memory page mp is suspended and it is erased if helpful.

With reference to FIG. 1, the memory page mp indicated with page 1 comprises four memory cells mc, each storing a memory word mw of 8 bits. More particularly, the four memory words mw comprise four corresponding predetermined sequences pre of digital values, respectively 00000001, 00000001, 00000001, 00000001.

With reference to FIG. 2, it is schematically represented a data to be written in the memory unit 1. Such data comprises four memory words mw1 of 8 bits. More particularly, the four memory words mw1 comprise four corresponding sequences post of digital values, respectively 00000000, 00000001, 00000001, 00000001. Such four memory words mw1 are intended to be stored in the page 1 of FIG. 1, inside the memory unit 1.

In this case, the method executes an erase operation on memory page 1 since the page check phase returns a negative value. In fact the first word mw1 00000000 intended to be stored includes the sequence 00000000 while the last digital value of the first memory word mw 00000001 already stored in memory unit comprises a digital value 1.

After the erase operation, a cell check phase is executed for the memory cells. More particularly, the cell check phase returns a positive value for the first word mw1 to be written since it comprises digital values 00000000, corresponding to the content of the memory cell mc just erased. The cell check phase returns negative value for the other words mw1 to be written 00000001, 00000001, 00000001 since corresponding memory cell mc stores the memory words mw 00000000, 00000000, 00000000, just erased.

The memory page mp indicated with page 2 in FIG. 1, comprises four memory cells mc, storing four memory words mw, respectively 00000001, 00000000, 00000001, 00000001. With reference to FIG. 2, data to be written in the page 2 comprises four memory words mw1, respectively 00000000, 00000001, 00000000, 00000000.

Also in this case, the page check phase returns a negative value for page 2. In fact the first word mw1 00000000 of the first word mw to be stored includes the digital values 00000000 while the last digital value of the first memory word mw 00000001 already stored in memory comprises a digital value 1.

After the erase operation on memory page 2, a cell check phase is executed for the memory cells. More particularly, the cell check phase returns a positive value for the first, the third and fourth words mw1 to be written while it returns negative value for the second word mw1, since the memory cell mc just erased comprises digital values 00000000 while the word mw1 to be stored is 00000001.

The memory page mp indicated with page 3 in FIG. 1, comprises four memory cells mc, storing four memory words mw, respectively 000000001 00000001, 00000001, 00000001.

Again with reference to FIG. 2, data to be written in the page 3 comprises four memory words mw1, respectively 11111111, 00000011, 00000011, 00000011.

In this case, the method skips the erase operation since the page check phase returns a positive value. In fact the digital values 0 of the words mw1 11111111, 00000011, 00000011, 00000011 intended to be stored are already digital values 0 in the memory words mw already stored in the page 3.

After the page check phase, the method provides to execute a cell check phase for the memory cells. More particularly, the cell check phase returns a negative value for the memory cells since the words mw1 11111111, 00000011, 00000011, 00000011 intended to be stored are different from the memory words mw1 already stored, 00000000, 00000001, 00000001, 00000001.

So, the method provides to execute the program operations for storing the words mw1 11111111, 00000011, 00000011, 00000011 in the respective memory cells mc of the page 3 of the memory unit 1.

The memory page mp indicated with page 4 in FIG. 1, comprises four memory cells mc, storing four memory words mw, respectively 00000011, 00000011, 01010101, 01111110, while data to be written in such page 4 comprises four memory words mw1, respectively 00000011, 00000011, 11111101, 11111110.

Also in this case, the method skips the erase operation since the page check phase returns a positive value; in fact the digital values 0 of the words mw1 00000011, 00000011, 11111101, 11111110 intended to be stored are already digital values 0 in the memory words mw already stored in the page 4.

After the page check phase, the method executes a cell check phase returning a negative values for memory cell 3 and 4, since the words mw1 11111101 and 11111110 are different from the memory words 01010101 and 01111110, and positive values for memory cell 1 and 2, since the words mw1 00000011 and 00000011 are equal to the memory words mw 00000011 and 00000011.

So, the method provides to execute the program operations for storing the third and fourth words mw1, 11111101 and 11111110, in the corresponding memory cells.

Finally, memory page mp indicated with page 5 in FIG. 1, comprises four memory cells mc, storing four memory words mw, respectively 00000001, 00000001, 00000001, 00000001, and data to be written in such page 5 comprises four memory words mw1, 00000001, 00000001, 00000001, 00000001, substantially corresponding to the memory words mw already store.

In this case, according to the method, both the erase operation on the memory page 5 and the program operations on the memory cells mc of this page 5 are skipped.

Advantageously, the number of erase operations skipped according to the method is higher in case of power interruption protection.

More particularly, up to 3 useless erase operations may be skipped. If power interruption protection is not used, a single erase operation is skipped on the memory page mp, when the page check phase returns a positive value. If power interruption protection is used and an unexpected power off does not occur, two erase operations are skipped when the page check phase returns a positive value. These operations are a first erase operation for erasing the backup buffer and a second erase operation for erasing the memory page mp of the memory unit 1.

If power interruption protection is used and an unexpected power off occurs, three erase operations are skipped when the page check phase returns a positive value: a first erase operation for erasing the backup buffer, a second erase operation for erasing the memory page mp before the power off, and a third erase operation for erasing the memory after the power off.

Advantageously, the number of program operations skipped according to the method is higher in case of power interruption protection.

More particularly, up to 3 useless program operations may be skipped. If power interruption protection is not used, a single program operation is skipped when the cell check phase returns a positive value. If power interruption protection is used and a power interruption does not occur, two program operations are skipped when the cell check phase returns a positive value: a first program operation to store memory word mw to be preserved in an erased backup buffer and a second program operation to store the word mw1 intended to be stored, in the memory cell mc of the erased memory pages.

If power interruption protection is used and a power interruption occurs, two program operations are skipped when the cell check phase returns a positive value: a first program operation to store memory word mw to be preserved in an erased backup buffer, a second program operation to store the word mw1 intended to be stored, in the memory cell mc of the erased memory page, before the power off, and a third program operation to restore the memory word mc in the memory cell mc after the power off.

Advantageously, the method for writing a non volatile memory unit reduces the number of erase operation on memory pages and the number of program operation on memory cells.

Advantageously, the number of erase operation and program operation is much more reduced when data is to be written with power interruption protection, especially when unexpected events like the power off occurs during the execution of write operation.

Advantageously the method avoids unnecessary stress on the memory unit and allows use of a same memory unit as long as possible.

That which is claimed:

1. A method for writing data in a non-volatile memory unit comprising a plurality of memory pages, each memory page including a plurality of memory cells, each memory cell storing a memory word, each memory word comprising a sequence of logic values, the method comprising:

for each memory cell of a given memory page, comparing a stored word with a word to be stored and returning a positive check if first logic values of the sequence of the word to be stored correspond to first logic values of the sequence of the stored word and otherwise returning a negative check;

if the check is negative, performing an erase operation by setting the sequence of the stored word to a sequence of first logic values; and for each memory cell; comparing the stored word with the word to be stored and executing a program operation if the word to be stored is different from the stored word, the program operation setting a sequence of the word to be stored into the memory cell.

2. A method according to claim 1 wherein, if the check is negative and the erase operation has been executed, the word to be stored is compared with the sequence of the stored word, and the program operation is executed if the word to be stored is different from the sequence of the stored word.

3. A method according to claim 1 wherein the negative check is returned when a first mismatch between the sequence of the word to be stored and the sequence of the stored word is detected.

4. A method according to claim 1 wherein each memory word comprises eight digital values.

5. A method for writing data in a non-volatile memory unit comprising a plurality of memory pages, each memory page including a plurality of memory cells, each memory cell storing a memory word, each memory word comprising a sequence of logic values, the method comprising:

for each memory page wherein data is to be stored
for each memory cell of a given memory page, comparing a stored word with a word to be stored and returning a positive check if first logic values of the sequence of the word to be stored correspond to first logic values of the sequence of the stored word,
when a first mismatch between the sequence of the word to be stored and the sequence of the stored word is detected, returning a negative check,
if the check is negative, performing an erase operation by setting the sequence of the stored word to a sequence of first logic values, and
for each memory cell, comparing the stored word with the word to be stored and executing a program operation if the word to be stored is different from the stored word, the program operation setting a sequence of the word to be stored into the memory cell.

6. A method according to claim 5 wherein, if the check is negative and the erase operation has been executed, the word to be stored is compared with the sequence of the stored word, and the program operation is executed if the word to be stored is different from the sequence of the stored word.

7. An electronic device comprising:
a non-volatile memory unit comprising a plurality of memory pages, each memory page including a plurality of memory cells, each memory cell storing a memory word, each memory word comprising a sequence of logic values; and
circuitry coupled to the non-volatile memory unit to
for each memory cell of a given memory page, comparing a stored word with a word to be stored and returning a positive check if first logic values of the sequence of the word to be stored correspond to first logic values of the sequence of the stored word and otherwise returning a negative check,
if the check is negative, performing an erase operation by setting the sequence of the stored word to a sequence of first logic values, and
for each memory cell, comparing the stored word with the word to be stored and executing a program operation if the word to be stored is different from the stored word, the program operation setting a sequence of the word to be stored into the memory cell.

8. An electronic device according to claim 7 wherein, if the check is negative and the erase operation has been executed, the word to be stored is compared with the sequence of the stored word, and the program operation is executed if the word to be stored is different from the sequence of the stored word.

9. An electronic device according to claim 7 wherein the negative check is returned when a first mismatch between the sequence of the word to be stored and the sequence of the stored word is detected.

10. An electronic device according to claim 7 wherein each memory word comprises eight digital values.

* * * * *